(12) United States Patent
Low et al.

(10) Patent No.: US 11,444,227 B2
(45) Date of Patent: Sep. 13, 2022

(54) LIGHT EMITTING DIODE PACKAGE WITH SUBSTRATE CONFIGURATION HAVING ENHANCED STRUCTURAL INTEGRITY

(71) Applicants: Tek Beng Low, Melaka (MY); Eng Wah Tan, Melaka (MY); Chee Sheng Lim, Melaka (MY)

(72) Inventors: Tek Beng Low, Melaka (MY); Eng Wah Tan, Melaka (MY); Chee Sheng Lim, Melaka (MY)

(73) Assignee: Dominant Opto Technologies SDN BHD

( * ) Notice: Subject to any disclaimer, the term of this patent is extended or adjusted under 35 U.S.C. 154(b) by 0 days.

(21) Appl. No.: 16/686,730

(22) Filed: Nov. 18, 2019

(65) Prior Publication Data
US 2021/0098669 A1 Apr. 1, 2021

Related U.S. Application Data

(60) Provisional application No. 62/908,688, filed on Oct. 1, 2019.

(51) Int. Cl.
*H01L 33/00* (2010.01)
*H01L 33/62* (2010.01)
*H01L 33/48* (2010.01)

(52) U.S. Cl.
CPC ............ *H01L 33/62* (2013.01); *H01L 33/483* (2013.01)

(58) Field of Classification Search
CPC . H01L 33/62; H01L 33/483; H01L 2933/005; H01L 33/54; H01L 33/647; H01L 51/524; H01L 51/525; H01L 2933/0033

USPC .......................................................... 257/99
See application file for complete search history.

(56) References Cited

U.S. PATENT DOCUMENTS

| | | |
|---|---|---|
| 5,291,038 A | 3/1994 | Hanamoto et al. |
| 6,181,003 B1 | 1/2001 | Ohuchi |
| 6,355,946 B1 | 3/2002 | Ishinaga |
| 6,407,411 B1 | 6/2002 | Wojnarowski et al. |
| 7,646,029 B2 | 1/2010 | Mueller et al. |
| 7,655,957 B2 | 2/2010 | Loh et al. |
| 8,314,479 B2 | 11/2012 | Wai et al. |
| 8,394,675 B2 | 3/2013 | Wai et al. |
| 8,674,488 B2 | 3/2014 | Wai et al. |
| 9,252,347 B2 | 2/2016 | Kong et al. |
| 9,559,275 B2 | 1/2017 | Kong et al. |
| 2002/0180345 A1 | 12/2002 | Hen |
| 2003/0116769 A1 | 6/2003 | Song et al. |
| 2005/0179041 A1 | 8/2005 | Harbers et al. |

(Continued)

FOREIGN PATENT DOCUMENTS

| | | |
|---|---|---|
| WO | WO 2009/072786 | 6/2009 |
| WO | WO 2009/082177 | 7/2009 |

*Primary Examiner* — Calvin Y Choi
(74) *Attorney, Agent, or Firm* — King & Partners, PLC (57) ABSTRACT

A light emitting diode package including: a housing, wherein the housing has a first axis defined as a width (w), and a second axis defined as a height (h); a lead frame associated with the housing, wherein the lead frame includes a first electrode and a second electrode; wherein the first electrode and the second electrode are spaced apart from each other to define an inter-digit region therebetween, wherein the inter-digit region comprises a length (l) that is offset (e.g., not parallel) relative to the width and/or height of the housing.

17 Claims, 5 Drawing Sheets

(56) References Cited

U.S. PATENT DOCUMENTS

| | | |
|---|---|---|
| 2006/0012299 A1 | 1/2006 | Suehiro et al. |
| 2006/0108669 A1 | 5/2006 | Matsumoto et al. |
| 2015/0084070 A1* | 3/2015 | Bierhuizen ............ H01L 33/62 |
| | | 257/88 |
| 2016/0148860 A1* | 5/2016 | Blakely ............... H01L 23/4952 |
| | | 257/88 |
| 2016/0308102 A1* | 10/2016 | Zitzlsperger .......... H01L 33/486 |
| 2017/0358561 A1* | 12/2017 | He ........................ H01L 25/167 |
| 2018/0188315 A1* | 7/2018 | Dobrinsky ............. H01L 33/00 |

* cited by examiner

LIGHT EMITTING DIODE PACKAGE WITH SUBSTRATE CONFIGURATION HAVING ENHANCED STRUCTURAL INTEGRITY

CROSS-REFERENCE TO RELATED APPLICATIONS

This application claims the benefit of U.S. Provisional Patent Application Ser. No. 62/908,688, entitled "IMPROVED LED PACKAGE WITH INTER-DIGIT DESIGN," filed Oct. 1, 2019—which is hereby incorporated herein by reference in its entirety, including all references cited therein.

STATEMENT REGARDING FEDERALLY SPONSORED RESEARCH OR DEVELOPMENT

Not applicable.

REFERENCE TO A SEQUENCE LISTING

Not applicable.

BACKGROUND OF THE INVENTION

1. Field of the Invention

The present invention relates in general to light emitting diode (LED) packages, and more particularly, to improved LED packages having a substrate and/or an inter-digit electrode configuration that provides for substantially enhanced structural integrity.

2. Background Art

LED packages have been known in the art for years and are the subject of a plurality of patents and publications, including: U.S. Pat. No. 9,559,275 entitled "Light Emitting Device Package and Light Unit Having the Same," U.S. Pat. No. 8,394,675 entitled "Manufacturing Light Emitting Diode (LED) Packages," U.S. Pat. No. 8,314,479 entitled "Leadframe Package with Recessed Cavity for LED," U.S. Pat. No. 7,646,029 entitled "LED Package Methods and Systems," U.S. Pat. No. 6,407,411 entitled "LED Lead Frame Assembly," United States Patent Application Publication Number 2005/0179041 entitled "Illumination System with LEDs," United States Patent Application Publication Number 2003/0116769 entitled "Light Emission Diode Package," United States Patent Application Publication Number 2002/0180345 entitled "Package Structure Containing Two LEDs," International Application Publication Number WO 2009/082177 entitled "Light Emitting Diode Package," and International Application Publication Number WO 2009/072786 entitled "LED Package and Method for Fabricating the Same"—all of which are hereby incorporated herein by reference in their entirety including all references cited therein.

U.S. Pat. No. 9,559,275 appears to disclose a light emitting device package. The light emitting device is a package body that includes a first recess which is provided with a bottom face and a plurality of inner walls surrounding the bottom face, the plurality of inner walls including a first inner wall and a second inner wall, which are opposing walls; a lead frame exposed at the bottom face of the package body, the lead frame including a bottom frame and a reflector exposed along one of the first inner wall and the second inner wall; a light emitting element provided on the lead frame; and a transparent material provided in the package body to cover the light emitting element. A material of the reflector is the same as a material of the bottom frame of the lead frame.

U.S. Pat. No. 8,394,675 appears to disclose a method of manufacturing an LED package that includes mounting a large panel frame/substrate (LPF/S) having a substantially square shape to a ring. The LPF/S includes a plurality of die pads and a corresponding plurality of leads arranged in a matrix pattern. Each of the die pads includes a planar chip attach surface. An LED chip is attached to the planar chip attach surface of each of the die pads. An encapsulant material is applied overlaying the LED chips and at least a part of the LPF/S. Each die pad and corresponding leads are separated from the LPF/S to form individual LED packages. The steps of attaching the LED chips and applying the encapsulant material are performed while the LPF/S is mounted to the ring.

U.S. Pat. No. 8,314,479 appears to disclose an LED package that includes a die pad having a bottom surface, an upper surface and a centrally located recessed cavity. The recessed cavity has a chip attach surface between the bottom surface and upper surface and sidewalls that extend from the recessed chip attach surface to the upper surface. The package additionally has leads arranged on opposing sides of the die pad. The leads have a bottom surface that is coextensive with the bottom surface of the die pad and an upper surface coextensive with the upper surface of the die pad. An LED chip is attached to the chip attach surface. The package further includes a package body having an encapsulant which fills space between the die pad and leads forming a bottom encapsulant surface that is coextensive with the bottom surfaces of the die pad and leads.

U.S. Pat. No. 7,646,029 appears to disclose methods and systems for LED modules that include an LED die integrated in an LED package with a submount that includes an electronic component for controlling the light emitted by the LED die. The electronic component integrated in the submount may include drive hardware, a network interface, memory, a processor, a switch-mode power supply, a power facility, or another type of electronic component.

U.S. Pat. No. 6,407,411 appears to disclose an improved LED lead frame packaging assembly that includes a thermally conducting, electrically insulating material that enhances the thermal conduction and structural integrity of the assembly, a UV-resistant encapsulant material, and an integral ESD material that reduces electrostatic discharge. The thermally conducting, electrically insulating material creates an electrically insulating, thermally conductive path in the lead frame assembly for dissipation of power and also acts as a mounting structure thus allowing for the use of a soft encapsulant material, preferably a silicone.

United States Patent Application Publication Number 2005/0179041 appears to disclose a system that includes a light emitting diode (LED), such as a projection system, which may be increased by using an LED chip that has a light emitting surface that emits light directly into any medium with a refractive index of less than or equal to approximately 1.25. For example, the LED chip may emit light directly into the ambient environment, such as air or gas, instead of into an encapsulant. The low refractive index decreases the étendue of the LED, which increases luminance. Moreover, without an encapsulant, a collimating optical element, such as a lens, can be positioned close to the light emitting surface of the LED chip, which advantageously permits the capture of light emitted at large angles.

A secondary collimating optical element may be used to assist in focusing the light on a target, such as a microdisplay.

United States Patent Application Publication Number 2003/0116769 appears to disclose an LED package, made of ceramic substrates and having a reflective metal plate. This LED package consists of a first ceramic substrate, which has a chip mounting area on its top surface, and is provided with a predetermined conductive pattern formed around the chip mounting area. One or more LED chips are seated on the chip mounting area of the first ceramic substrate, and are connected to the conductive pattern. A second ceramic substrate is mounted on the top surface of the first ceramic substrate and has a cavity at a position corresponding to the chip mounting area. The reflective metal plate is set in the cavity of the second ceramic substrate to surround the LED chips. This LED package effectively controls the luminous intensity of the LED chips and the angular distribution of the luminance. The reflective metal plate also collaterally acts as a heat sink effectively dissipating heat from the LED chips to the surroundings of the LED package.

United States Patent Application Publication Number 2002/0180345 appears to disclose a package structure containing two LEDs (light emitting diodes), which are packaged in cascade and capable of emitting lights with different wavelengths. For example, by packaging a yellow LED die above a blue LED die or packaging a blue LED die above a yellow LED die, a desaturated blue, desaturated yellow or white light can be obtained when a blue light is emitted through a yellow light or a yellow light is emitted through a blue light. The present invention can be a single-anode-single-cathode or a double-anode-single-cathode package structure, wherein the latter structure can continually change the emitted light in a certain range by adjusting input voltages of the anodes.

International Application Publication Number WO 2009/082177 appears to disclose a light emitting diode (LED) package that includes a light emitting diode (LED) package that includes a pair of lead frames connected with at least one LED chip through a metal wire, a package body integrally fixed with the lead frames and having a cavity having an open top, a lead frame bent downwardly to a lower part of an external mounting surface of the package body, a light-transmissive, transparent resin covering the LED chip and filling the cavity, a recess formed in a bottom surface of the cavity, in which the LED chip is mounted, and a transparent resin including a fluorescent material formed in the recess and the cavity. Accordingly, the amount of light-transmissive, transparent resin filling the cavity is reduced to save on manufacturing costs, and the height of the resin is lowered to improve the luminance of light. Also, the height of the package body is lowered, contributing to manufacturing a small product.

International Application Publication Number WO 2009/072786 appears to disclose an LED package that comprises a base having an LED chip mounted thereon, an encapsulation member formed by a light-transmittable resin to encapsulate the LED chip, and a housing formed to expose a top portion of the encapsulation member and to encompass a side surface of the encapsulation member, wherein the encapsulation member is formed by a transfer molding process using a mold to have a predetermined shape. Further, the housing may be light-transmittable.

While the above-identified patents do appear to disclose a plurality of LED package configurations, none of the above-identified patents appear to disclose an improved LED package having a substrate and/or an inter-digit electrode configuration that provides for substantially enhanced structural integrity.

These and other objects of the present invention will become apparent in light of the present specification, claims, and drawings.

SUMMARY OF THE INVENTION

The present invention is directed to a light emitting diode package comprising, consisting essentially of, and/or consisting of: (a) a housing, wherein the housing comprises a first axis defined as a width (w), and a second axis defined as a height (h); (b) a lead frame associated with the housing, wherein the lead frame comprises a first electrode and a second electrode; (c) wherein the first electrode and the second electrode are spaced apart from each other to define an inter-digit region therebetween, wherein the inter-digit region comprises a length (l); and (d) wherein the length of the inter-digit region is offset relative to at least one of the width and the height of the housing.

In a preferred embodiment of the present invention, the length of the inter-digit region comprises a single-step configuration.

In another preferred embodiment of the present invention, the length of the inter-digit region comprises a double-step configuration.

In yet another preferred embodiment of the present invention, the length of the inter-digit region comprises a multi-step configuration.

In a preferred embodiment of the present invention, the first electrode comprises an anode, and the second electrode comprises a cathode.

In another preferred embodiment of the present invention, the first electrode comprises a pair of anodes, and the second electrode comprises a pair of cathodes.

In yet another preferred embodiment of the present invention, the area of the first electrode and the area of the second electrode are not equal.

In a preferred embodiment of the present invention, the area of the first electrode is at least two times greater than the area of the second electrode.

In another preferred embodiment of the present invention, the area of the first electrode is at least three times greater than the area of the second electrode.

In yet another preferred embodiment of the present invention, the area of the first electrode is at least five times greater than the area of the second electrode.

The present invention is also directed to a light emitting diode package comprising, consisting essentially of, and/or consisting of: (a) a housing; (b) a lead frame associated with the housing, wherein the lead frame comprises a first electrode and a second electrode spaced apart from each other to define an inter-digit region therebetween; and (c) an inter-digit configuration formed by the first electrode and the second electrode for increasing the structural integrity of the light emitting diode package.

In a preferred embodiment of the present invention, the structural integrity of the light emitting diode package is at least approximately 25% percent greater than a light emitting diode package having a parallel inter-digit configuration.

In another preferred embodiment of the present invention, the structural integrity of the light emitting diode package is at least approximately 50% percent greater than a light emitting diode package having a parallel inter-digit configuration.

In yet another preferred embodiment of the present invention, the structural integrity of the light emitting diode package is at least approximately 100% percent greater than a light emitting diode package having a parallel inter-digit configuration.

In another aspect of the present invention, the structural integrity of the light emitting diode package is at least approximately 150% percent greater than a light emitting diode package having a parallel inter-digit configuration.

The present invention is further directed to a light emitting diode package comprising, consisting essentially of, and/or consisting of: (a) a housing; (b) a lead frame associated with the housing, wherein the lead frame comprises an anode and a cathode spaced apart from each other to define an inter-digit region therebetween; (c) an inter-digit configuration formed by the first electrode and the second electrode for increasing the structural integrity of the light emitting diode package; and (d) wherein the structural integrity of the light emitting diode package is at least approximately 150% percent greater than a light emitting diode package having a parallel inter-digit configuration.

BRIEF DESCRIPTION OF THE DRAWINGS

Certain embodiments of the present invention are illustrated by the accompanying figures. It will be understood that the figures are not necessarily to scale and that details not necessary for an understanding of the invention or that render other details difficult to perceive may be omitted.

It will be further understood that the invention is not necessarily limited to the particular embodiments illustrated herein.

The invention will now be described with reference to the drawings wherein.

DETAILED DESCRIPTION OF THE INVENTION

While this invention is susceptible of embodiment in many different forms, there is shown in the drawings and described herein in detail several specific embodiments with the understanding that the present disclosure is to be considered as an exemplification of the principles of the invention and is not intended to limit the invention to the embodiments illustrated.

It will be understood that like or analogous elements and/or components, referred to herein, may be identified throughout the drawings by like reference characters. In addition, it will be understood that the drawings are merely schematic representations of one or more embodiments of the invention, and some of the components may have been distorted from their actual scale for purposes of pictorial clarity.

Figure 1A:
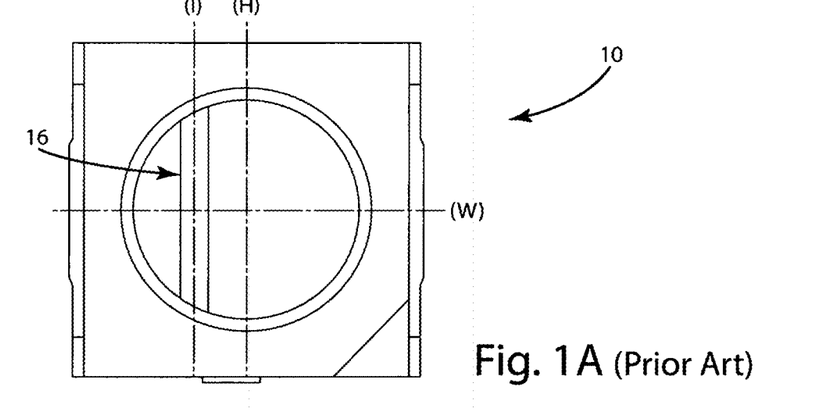
FIG. 1A is a top view of a conventional light emitting diode package having a parallel inter-digit configuration.
Figure 1B:
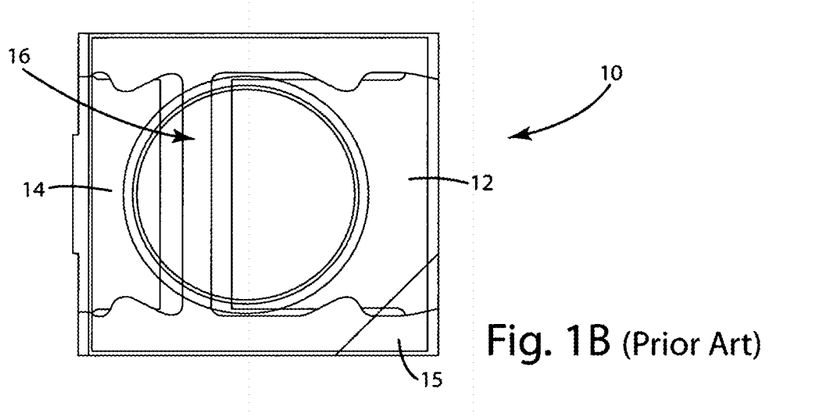
FIG. 1B is a bottom view of the light emitting diode package of FIG. 1A.
Figure 1C:
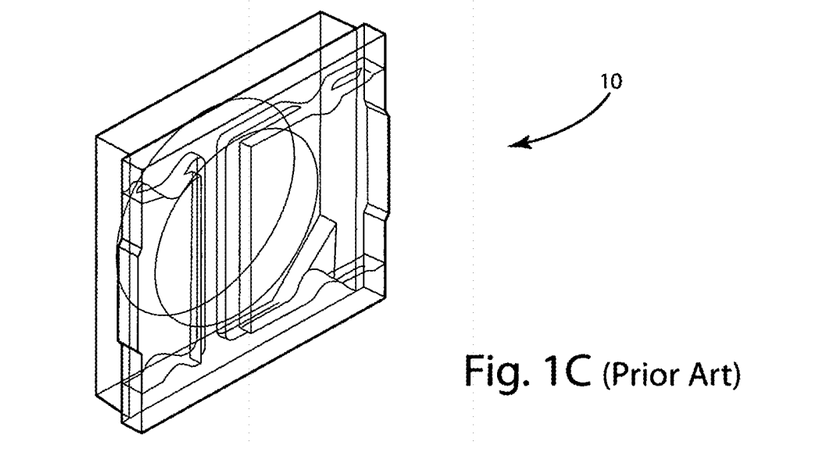
FIG. 1C is a front perspective view of the light emitting diode package of FIG. 1A.

Various embodiments of the present invention relate to LED packages having inter-digit electrode configurations that provide for substantially enhanced structural integrity relative to prior art/conventional light emitting diode packages having parallel inter-digit configurations. As is shown in FIGS. 1A-1C, conventional LED packages 10 include first electrode 12, second electrode 14, housing 15 having a first axis defined as a width (w), and a second axis defined as a height (h), and inter-digit region 16 having a length (l) which runs parallel to the height of the housing and orthogonal to the width of the housing. As will be shown experimentally below, the LED packages of the present invention have inter-digit configurations that are not parallel to either the height, or the width of the LED package housing. Such inter-digit configurations result in LED packages having structural integrity that is 150% greater than conventional, prior art LED packages.

Figure 2A:
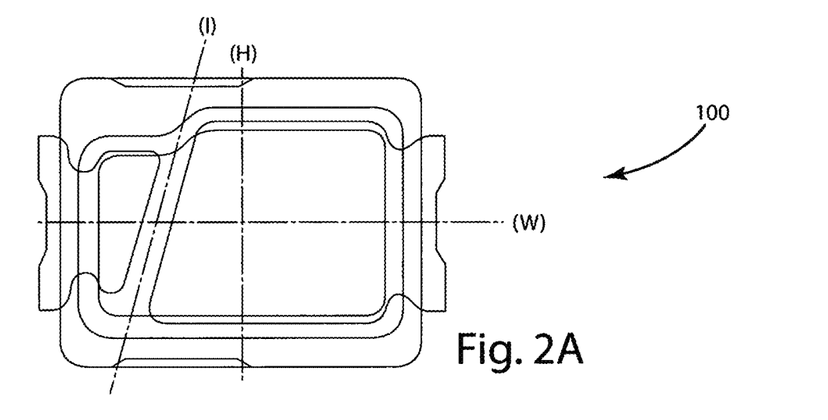
FIG. 2A is a top view of a novel light emitting diode package having an offset inter-digit configuration.
Figure 2B:
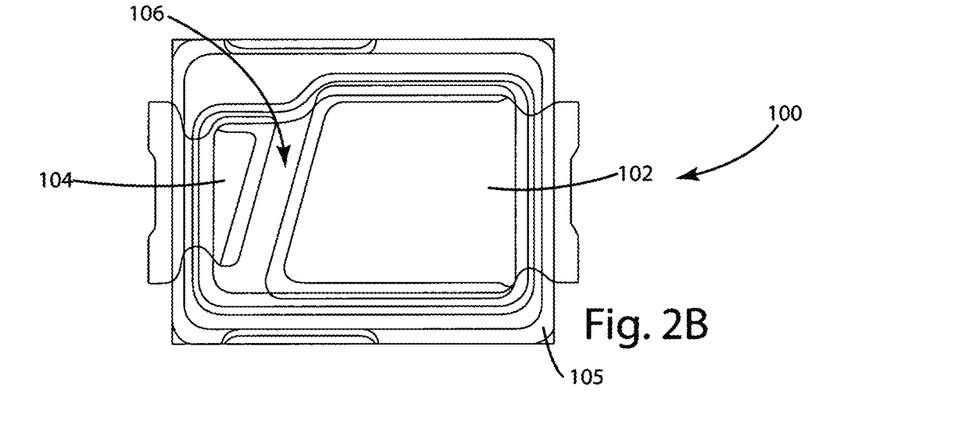
FIG. 2B is a bottom view of the light emitting diode package of FIG. 2A.
Figure 2C:
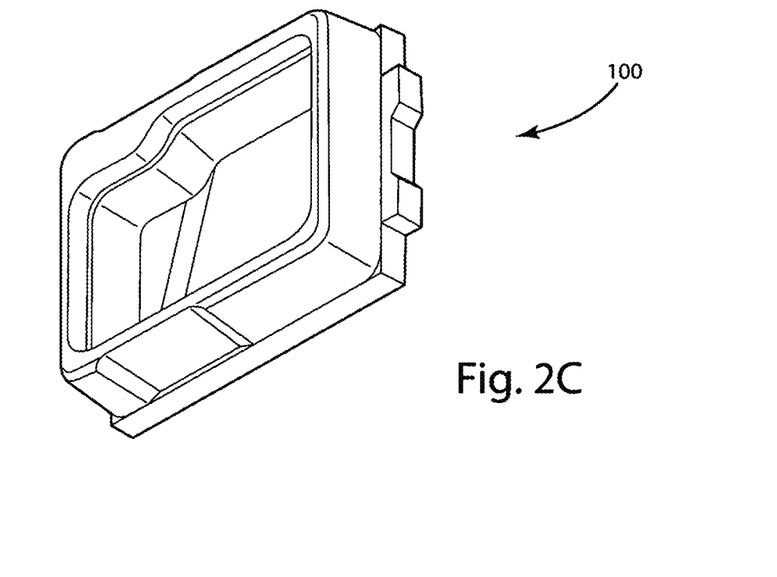
FIG. 2C is a front perspective view of the light emitting diode package of FIG. 2A.

Referring now to FIGS. 2A-2C, light emitting diode package 100 of the present invention includes a lead frame having first electrode 102 (e.g., anode) and second electrode 104 (e.g., cathode), and housing 105. Housing 105 includes a first axis defined as a width (w), and a second axis defined as a height (h). In accordance with the present invention, first electrode 102 and second electrode 104 are spaced apart from each other to define inter-digit region 106 therebetween, wherein inter-digit region 106 comprises a length (l). Length (l) of inter-digit region 106 is offset (e.g., non-parallel, angled, single-stepped, double-stepped, multi-stepped, etcetera) relative to at least one of the width (w) and the height (h) of housing 105.

Figure 3A:
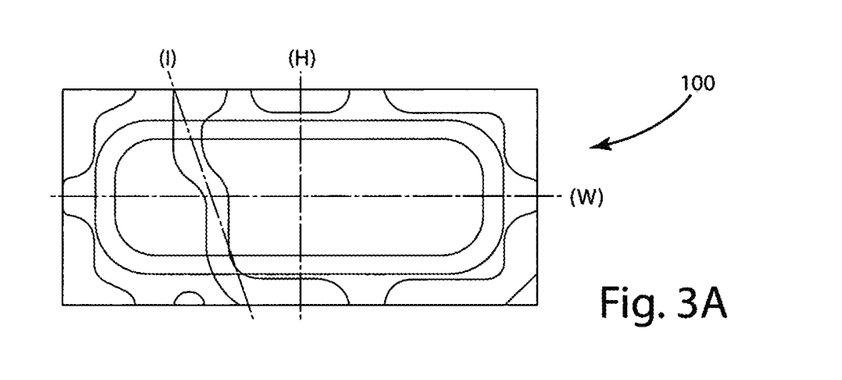
FIG. 3A is a top view of a novel light emitting diode package having a non-parallel, single-step inter-digit configuration.
Figure 3B:
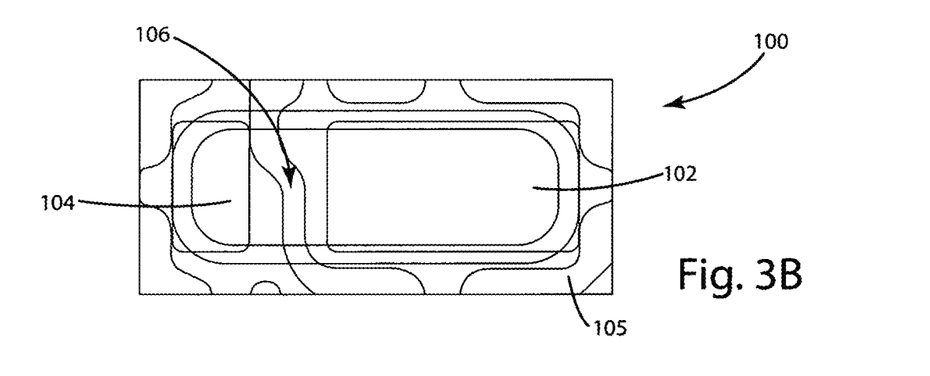
FIG. 3B is a bottom view of the light emitting diode package of FIG. 3A.
Figure 3C:
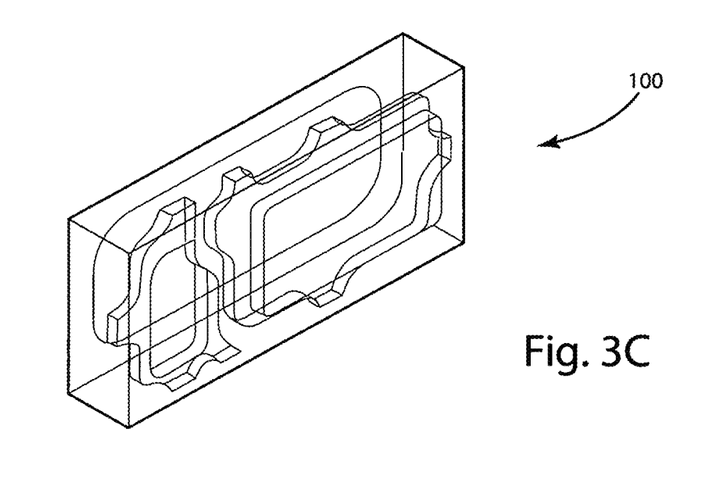
FIG. 3C is a front perspective view of the light emitting diode package of FIG. 3A.

As is best shown in FIGS. 3A-3C, length (l) of inter-digit region 106 include a non-parallel, single-step relative to at least one of the width (w) and the height (h) of housing 105.

Figure 4A:
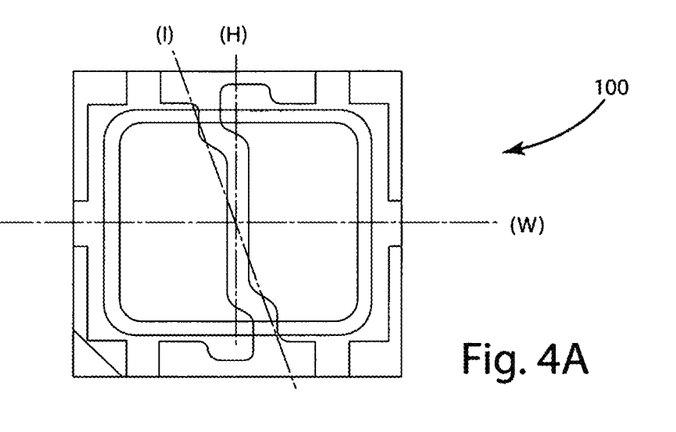
FIG. 4A is a top view of a novel light emitting diode package having a non-parallel, multi-step inter-digit configuration.
Figure 4B:
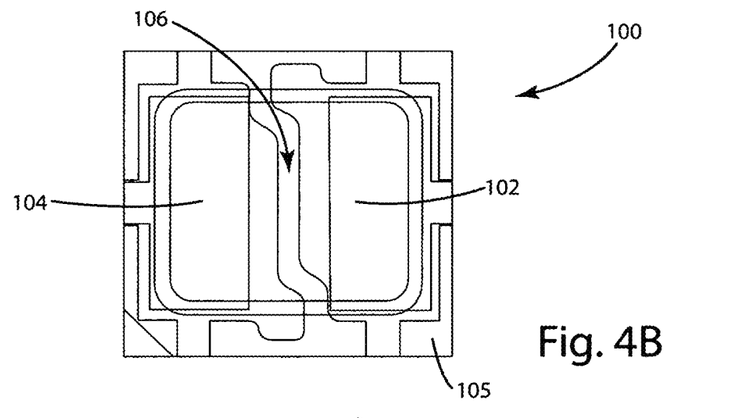
FIG. 4B is a bottom view of the light emitting diode package of FIG. 4A.
Figure 4C:
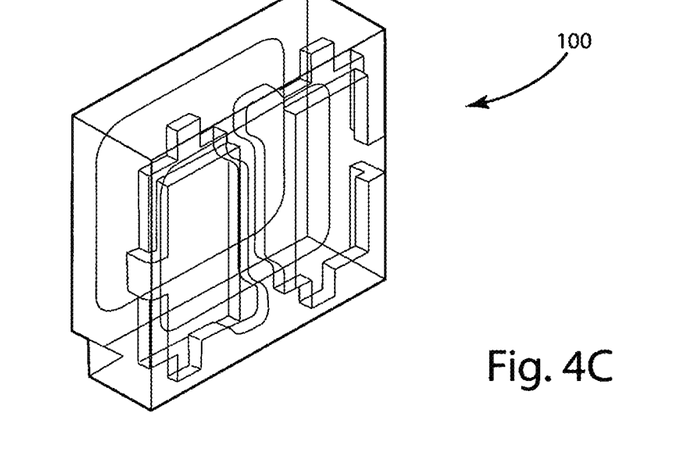
FIG. 4C is a front perspective view of the light emitting diode package of FIG. 4A.
Figure 5:
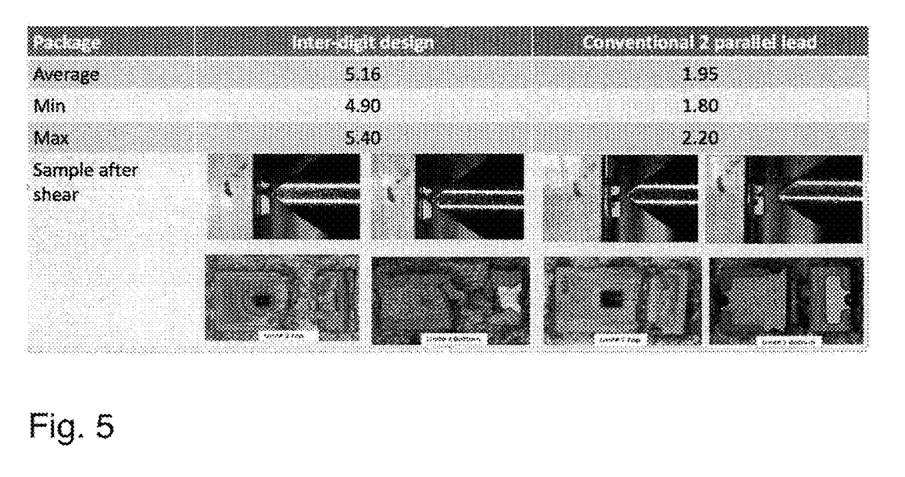
FIG. 5 is experimental data that shows the increase in structural integrity of light emitting diode packages of the present invention.

As is best shown in FIGS. 4A-4C, length (l) of inter-digit region 106 include a non-parallel, double-step relative to at least one of the width (w) and the height (h) of housing 105.

In preferred embodiments of the present invention and as is shown in FIGS. 2A-4C, the area of first electrode 102, and the area of second electrode 104 are not equal. In these embodiments, the area of first electrode 102 is at least two times greater, and sometimes 3-5 times greater, than the area of second electrode 104.

As is shown in FIGS. 2A-5, the present invention is also directed to a light emitting diode package 100, comprising: housing 105; a lead frame associated with housing 105, wherein the lead frame comprises first electrode 102 and second electrode 104 which are spaced apart from each other to define inter-digit region 106 therebetween. The inter-digit configuration formed by the first electrode and the second electrode increases the structural integrity of light emitting diode package 100 by at least approximately 25% and up to approximately 150% relative to the prior art light emitting diode package shown in FIGS. 1A-1C.

The foregoing description merely explains and illustrates the invention and the invention is not limited thereto except insofar as the appended claims are so limited, as those skilled in the art who have the disclosure before them will be able to make modifications without departing from the scope of the invention.

While certain embodiments have been illustrated and described, it should be understood that changes and modifications can be made therein in accordance with ordinary skill in the art without departing from the technology in its broader aspects as defined in the following claims.

The embodiments, illustratively described herein may suitably be practiced in the absence of any element or elements, limitation or limitations, not specifically disclosed herein. Thus, for example, the terms "comprising," "including," "containing," etcetera shall be read expansively and without limitation. Additionally, the terms and expressions employed herein have been used as terms of description and not of limitation, and there is no intention in the use of such terms and expressions of excluding any equivalents of the features shown and described or portions thereof, but it is recognized that various modifications are possible within the scope of the claimed technology. Additionally, the phrase "consisting essentially of" will be understood to include those elements specifically recited and those additional elements that do not materially affect the basic and novel characteristics of the claimed technology. The phrase "consisting of" excludes any element not specified.

The present disclosure is not to be limited in terms of the particular embodiments described in this application. Many modifications and variations can be made without departing from its spirit and scope, as will be apparent to those skilled in the art. Functionally equivalent methods and compositions within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can of course vary. It is also to be understood that the terminology used herein is for the purpose of describing particular embodiments only, and is not intended to be limiting.

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etcetera. As a non-limiting example, each range discussed herein can be readily broken down into a lower third, middle third and upper third, etcetera. As will also be understood by one skilled in the art all language such as "up to," "at least," "greater than," "less than," and the like, include the number recited and refer to ranges which can be subsequently broken down into subranges as discussed above. Finally, as will be understood by one skilled in the art, a range includes each individual member.

All publications, patent applications, issued patents, and other documents referred to in this specification are herein incorporated by reference as if each individual publication, patent application, issued patent, or other document was specifically and individually indicated to be incorporated by reference in its entirety. Definitions that are contained in text incorporated by reference are excluded to the extent that they contradict definitions in this disclosure.

Other embodiments are set forth in the following claims.

What is claimed and desired to be secured by Letters Patent of the United States is:

1. A light emitting diode package, comprising:
   a housing, wherein the housing comprises a first axis defined as a width, and a second axis defined as a height;
   a lead frame positioned at least partially within the housing, wherein the lead frame comprises a first electrode and a second electrode;
   wherein a portion of the first electrode and a portion of the second electrode within the housing are spaced apart from each other to define an inter-digit region therebetween, and wherein the inter-digit region is within the housing and comprises a length; and
   wherein the length of the inter-digit region is offset relative to at least one of the width and the height of the housing.

2. The light emitting diode package according to claim 1, wherein the length of the inter-digit region comprises a single-step configuration.

3. The light emitting diode package according to claim 1, wherein the length of the inter-digit region comprises a double-step configuration.

4. The light emitting diode package according to claim 1, wherein the length of the inter-digit region comprises a multi-step configuration.

5. The light emitting diode package according to claim 1, wherein the first electrode comprises an anode.

6. The light emitting diode package according to claim 1, wherein the second electrode comprises a cathode.

7. The light emitting diode package according to claim 1, wherein the first electrode comprises a pair of anodes.

8. The light emitting diode package according to claim 1, wherein the second electrode comprises a pair of cathodes.

9. The light emitting diode package according to claim 1, wherein the area of the first electrode and the area of the second electrode are not equal.

10. The light emitting diode package according to claim 1, wherein the area of the first electrode is at least two times greater than the area of the second electrode.

11. The light emitting diode package according to claim 1, wherein the area of the first electrode is at least three times greater than the area of the second electrode.

12. The light emitting diode package according to claim 1, wherein the area of the first electrode is at least five times greater than the area of the second electrode.

13. A light emitting diode package, comprising:
    a housing, wherein the housing comprises a first axis defined as a width, and a second axis defined as a height;
    a lead frame positioned at least partially within the housing, wherein the lead frame comprises a first electrode and a second electrode;
    wherein a portion of the first electrode and a portion of the second electrode within the housing are spaced apart from each other to define an inter-digit region therebetween, and wherein the inter-digit region is within the housing and comprises a length;

wherein the length of the inter-digit region is offset relative to at least one of the width and the height of the housing; and an inter-digit configuration formed by the first electrode and the second electrode for increasing the structural integrity of the light emitting diode package.

14. The light emitting diode package according to claim 13, wherein the structural integrity of the light emitting diode package is at least approximately 25% percent greater than a light emitting diode package having a parallel inter-digit configuration.

15. The light emitting diode package according to claim 13, wherein the structural integrity of the light emitting diode package is at least approximately 50% percent greater than a light emitting diode package having a parallel inter-digit configuration.

16. The light emitting diode package according to claim 13, wherein the structural integrity of the light emitting diode package is at least approximately 100% percent greater than a light emitting diode package having a parallel inter-digit configuration.

17. The light emitting diode package according to claim 13, wherein the structural integrity of the light emitting diode package is at least approximately 150% percent greater than a light emitting diode package having a parallel inter-digit configuration.

* * * * *